(12) United States Patent
Nagoya

(10) Patent No.: US 12,451,367 B2
(45) Date of Patent: Oct. 21, 2025

(54) TEMPORARY PROTECTIVE FILM FOR SEMICONDUCTOR ENCAPSULATION MOLDING, LEAD FRAME WITH TEMPORARY PROTECTIVE FILM, ENCAPSULATION MOLDED BODY WITH TEMPORARY PROTECTIVE FILM, AND METHOD FOR MANUFACTURING SEMICONDUCTOR DEVICE

(71) Applicant: Showa Denko Materials Co., Ltd., Tokyo (JP)

(72) Inventor: Tomohiro Nagoya, Tokyo (JP)

( * ) Notice: Subject to any disclaimer, the term of this patent is extended or adjusted under 35 U.S.C. 154(b) by 397 days.

(21) Appl. No.: 17/613,933

(22) PCT Filed: Jun. 16, 2020

(86) PCT No.: PCT/JP2020/023647
§ 371 (c)(1),
(2) Date: Nov. 23, 2021

(87) PCT Pub. No.: WO2020/255975
PCT Pub. Date: Dec. 24, 2020

(65) Prior Publication Data
US 2022/0319873 A1  Oct. 6, 2022

(30) Foreign Application Priority Data
Jun. 19, 2019 (JP) ................. 2019-113464

(51) Int. Cl.
*H01L 21/56* (2006.01)
*C09J 7/25* (2018.01)
(Continued)

(52) U.S. Cl.
CPC .............. *H01L 21/568* (2013.01); *C09J 7/25* (2018.01); *C09J 7/30* (2018.01); *C09J 179/08* (2013.01);
(Continued)

(58) Field of Classification Search
None
See application file for complete search history.

(56) References Cited

U.S. PATENT DOCUMENTS 6,700,185 B1    3/2004  Kawai et al.
7,449,367 B2   11/2008  Matsuura et al.
(Continued)

FOREIGN PATENT DOCUMENTS

CN    1698200    11/2005
CN  101298543    11/2008
(Continued)

OTHER PUBLICATIONS

International Preliminary Report on Patentability with Written Opinion dated Dec. 30, 2021 for PCT/JP2020/023647.
(Continued)

*Primary Examiner* — Cory W Eskridge
(74) *Attorney, Agent, or Firm* — SOEI PATENT & LAW FIRM

(57) ABSTRACT

A temporary protective film for semiconductor encapsulation molding, the temporary protective film including a support film, an adhesive layer provided on one surface of the support film, and a non-adhesive layer provided on a surface of the support film on an opposite side from the surface provided with the adhesive layer. The thickness of the non-adhesive layer is 10 μm or less. A surface of the non-adhesive layer on an opposite side of a surface in contact with the support film, has a surface roughness Ra of 0.1 μm or more.

9 Claims, 8 Drawing Sheets

(51) Int. Cl.
  *C09J 7/30*      (2018.01)
  *C09J 179/08*    (2006.01)
  *H01L 21/683*    (2006.01)
  *H01L 23/00*     (2006.01)
  *H01L 23/31*     (2006.01)
  *H01L 23/495*    (2006.01)

(52) U.S. Cl.
  CPC ...... *H01L 21/6836* (2013.01); *H01L 23/3107* (2013.01); *H01L 23/495* (2013.01); *H01L 24/48* (2013.01); *H01L 2224/48175* (2013.01)

(56) References Cited

U.S. PATENT DOCUMENTS

| | | | |
|---|---|---|---|
| 2003/0145949 A1 | 8/2003 | Tanaka et al. | |
| 2004/0124544 A1* | 7/2004 | Kawai | C09J 7/22 257/782 |
| 2006/0043607 A1* | 3/2006 | Matsuura | H01L 21/561 257/782 |
| 2010/0239858 A1* | 9/2010 | Masuko | C09J 179/08 528/65 |
| 2011/0210407 A1* | 9/2011 | Katayama | C08G 73/14 257/E29.166 |
| 2013/0237017 A1* | 9/2013 | Kondo | H01L 24/97 428/335 |
| 2014/0252646 A1 | 9/2014 | Hung et al. | |
| 2017/0365500 A1* | 12/2017 | Nakajima | H01L 21/6836 |
| 2018/0315729 A1* | 11/2018 | Sugo | H01L 24/85 |
| 2018/0327637 A1 | 11/2018 | Yamagishi et al. | |
| 2019/0103298 A1* | 4/2019 | Hayashishita | C09J 7/22 |
| 2020/0118841 A1* | 4/2020 | Tomori | H01L 21/561 |
| 2022/0049132 A1* | 2/2022 | Lee | B32B 27/16 |

FOREIGN PATENT DOCUMENTS

| | | |
|---|---|---|
| CN | 101490194 | 7/2009 |
| CN | 101796153 | 8/2010 |
| CN | 102061136 | 5/2011 |
| CN | 102134452 | 7/2011 |
| CN | 102134453 | 7/2011 |
| CN | 102414017 | 4/2012 |
| JP | H2-146144 | 12/1990 |
| JP | H5-092534 | 4/1993 |
| JP | H5-129473 | 5/1993 |
| JP | H5-175332 | 7/1993 |
| JP | H8-001220 | 7/1996 |
| JP | H10-012773 | 1/1998 |
| JP | 2003-086614 | 3/2003 |
| JP | 2003-249617 | 9/2003 |
| JP | 2004-035757 | 2/2004 |
| JP | 2004-217838 | 8/2004 |
| JP | 2005-116919 | 4/2005 |
| JP | 2005-239889 | 9/2005 |
| JP | 2006-312703 | 11/2006 |
| JP | 2008-095063 | 4/2008 |
| JP | 2008-131006 | 6/2008 |
| JP | 2009-044010 | 2/2009 |
| JP | 2011-190419 | 9/2011 |
| JP | 2012-059846 | 3/2012 |
| JP | 2016-196322 | 11/2016 |
| KR | 10-2002-0044586 | 6/2002 |
| KR | 10-2002-0060143 | 7/2002 |
| KR | 10-2011-0097798 | 8/2011 |
| KR | 10-2017-0007327 | 1/2017 |
| SG | 11202001674 W | 9/2019 |
| TW | 200423316 | 11/2004 |
| TW | 200932860 | 8/2009 |
| TW | 201443193 | 11/2014 |
| WO | 01/035460 | 5/2001 |
| WO | 2004/075293 | 9/2004 |
| WO | 2009/044732 | 4/2009 |
| WO | 2017/149925 | 9/2017 |
| WO | 2017/164352 | 9/2017 |
| WO | WO-2017169747 A1 * | 10/2017 ............ C09J 201/00 |
| WO | 2018/181536 | 10/2018 |
| WO | 2018/207408 | 11/2018 |

OTHER PUBLICATIONS

International Search Report dated Sep. 8, 2020 for PCT/JP2020/023647.
International Search Report dated Apr. 24, 2018 for PCT/JP2018/002313.
International Search Report dated Apr. 2, 2019 for PCT/JP2019/008205.
International Search Report dated Nov. 12, 2019 for PCT/JP2019/036407.
International Search Report dated Feb. 4, 2020 for PCT/JP2019/043750.
International Preliminary Report on Patentability with Written Opinion dated May 20, 2021 for PCT/JP2019/043750.
International Preliminary Report on Patentability with Written Opinion dated Mar. 31, 2022 for PCT/JP2019/036407.
Soei Patent and Law Firm, Statement of Related Matters, dated Jun. 10, 2025.

* cited by examiner

TEMPORARY PROTECTIVE FILM FOR SEMICONDUCTOR ENCAPSULATION MOLDING, LEAD FRAME WITH TEMPORARY PROTECTIVE FILM, ENCAPSULATION MOLDED BODY WITH TEMPORARY PROTECTIVE FILM, AND METHOD FOR MANUFACTURING SEMICONDUCTOR DEVICE

CROSS-REFERENCE TO RELATED APPLICATIONS

This application is a 35 U.S.C. § 371 national phase application of PCT/JP2020/023647, filed on Jun. 16, 2020, which claims priority to Japanese Patent Application No. 2019-113464, filed on Jun. 19, 2019

TECHNICAL FIELD

The present invention relates to a temporary protective film for semiconductor encapsulation molding, a temporary protective film-attached lead frame, a temporary protective film-attached encapsulation molded body, and a method for manufacturing a semiconductor device.

BACKGROUND ART

Conventionally, semiconductor packages having a structure in which a semiconductor element is adhered onto a die pad by means of an adhesive such as a silver paste, the semiconductor element and a lead frame are joined by a wire, and the entirety is encapsulated while leaving outer leads for external connection, have been used. However, as the demand for density increase, area reduction, thickness reduction, and the like of semiconductor packages has increased in recent years, semiconductor packages of various structures have been proposed. Examples thereof include LOC (lead on chip) and COL (chip on lead) structures; however, these have limitations in view of area reduction and thickness reduction.

In order to solve these problems, packages having a structure in which only one surface (semiconductor element side) of the package is encapsulated, and a lead frame exposed at the back face is used for external connection, have been developed (Patent Literatures 1 and 2). In packages having this structure, since lead frames are not protruding from the encapsulation resin, area reduction and thickness reduction can be promoted. One of the methods for manufacturing a semiconductor device having this package structure is a manufacturing method including the following steps.

(1) A step of sticking a temporary protective film for semiconductor encapsulation molding onto the back face, which is one surface of a lead frame having a die pad and an inner lead;
(2) a step of mounting or adhering a semiconductor element on a surface of the die pad, the surface being on the opposite side of the temporary protective film;
(3) a step of providing a wire that connects the semiconductor element to the inner lead;
(4) a step of forming an encapsulation layer that encapsulates the semiconductor element and the wire to obtain an encapsulation molded body having the lead frame, the semiconductor element, and the encapsulation layer; and
(5) a step of detaching the temporary protective film from the encapsulation molded body.

The manufacture of a semiconductor package according to this method may cause defects in which the encapsulation resin wraps around the back face of a lead frame during encapsulation molding. As a method for preventing such inconvenience, there is known a method of sticking a temporary protective film as an adhesive film for semiconductor to the back face of a lead frame to protect the back face of the lead frame; encapsulation molding the semiconductor element mounted on a surface of the lead frame, the surface being on the opposite side of the back face; and then tearing off the temporary protective film.

CITATION LIST

Patent Literature

Patent Document 1: Japanese Unexamined Patent Publication No. H5-129473
Patent Document 2: Japanese Unexamined Patent Publication No. H10-12773

SUMMARY OF INVENTION

Technical Problem

Since a temporary protective film used for the manufacture of semiconductor devices is required to withstand the heat of a semiconductor assembling process, a polyimide film is frequently used as a base material (support film). However, when a film made of a resin, such as a polyimide film, was used, there were occasions in which conveyance failure occurred in the manufacturing process due to poor sliding and the like during conveyance in an apparatus.

Thus, according to an aspect of the present invention, there is provided a temporary protective film for semiconductor encapsulation molding capable of suppressing conveyance failure on a stage in a process for manufacturing a semiconductor device.

Solution to Problem

An aspect of the present invention relates to a temporary protective film for semiconductor encapsulation molding for temporarily protecting a lead frame during encapsulation molding of forming an encapsulation layer that encapsulates a semiconductor element mounted on the lead frame. This temporary protective film comprises a support film, an adhesive layer provided on one surface of the support film, and a non-adhesive layer provided on the surface of the support film on the opposite side from the surface provided with the adhesive layer. The thickness of the non-adhesive layer is 10 μm or less. The surface of the non-adhesive layer on the opposite side from the surface in contact with the support film has a surface roughness of 0.1 μm or more. The surface roughness Ra is a value measured by a laser microscope under a condition that a magnification ratio of an object lens is 50 times. The surface roughness Ra may be a value calculated according to the standard of JIS B0601: 2001.

When the temporary protective film is attached to a lead frame having a die pad and an inner lead so that the adhesive layer is in contact with the lead frame, the 90° peel strength between the adhesive layer and the lead frame at 25° C. may be 5 N/m or more.

When the temporary protective film is attached to a lead frame having a die pad and an inner lead so that the adhesive layer is in contact with the lead frame, a semiconductor element is mounted on a surface of the die pad on the opposite side of the temporary protective film, and an encapsulation layer encapsulating the semiconductor element while being in contact with the adhesive layer is formed, the 90° peel strength between the adhesive layer and the lead frame as well as the encapsulation layer may be 1000 N/m or less, at least a portion of the temperature of 0° C. to 250° C., at least a portion of the temperature range of 80° C. to 250° C., or at the temperature at the time of detaching the temporary protective film from the lead frame and the encapsulation layer.

The glass transition temperature of the adhesive layer may be 100° C. to 300° C. The elastic modulus of the adhesive layer may be 1 MPa or more at 230° C. The 5% weight reduction temperature of the adhesive layer may be 300° C. or higher. The adhesive layer may comprise a thermoplastic resin having at least one functional group selected from the group consisting of an amide group, an ester group, an imide group, an ether group, and a sulfone group, or a thermoplastic resin having at least one functional group selected from the group consisting of an amide group, an ester group, an imide group, and an ether group.

The support film may be a film comprising a polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, a polyallylate, an aromatic polyether ether ketone, and polyethylene naphthalate. The ratio of the thickness of the adhesive layer to the thickness of the support film may be 0.5 or less. The elastic modulus of the non-adhesive layer may be 10 MPa or more at 230° C.

Another aspect of the present invention relates to a reel body comprising a winding core and the temporary protective film wound around the winding core.

Still another aspect of the present invention relates to a temporary protective film-attached lead frame comprising a lead frame having a die pad and an inner lead; and the above-described temporary protective film, wherein the temporary protective film is attached to the lead frame so that an adhesive layer of the temporary protective film is in contact with one surface of the lead frame.

An aspect of the present invention relates to a temporary protective film-attached encapsulation molded body, comprising a lead frame having a die pad and an inner lead; a semiconductor element mounted on the die pad; a wire connecting the semiconductor element and the inner lead; an encapsulation layer encapsulating the semiconductor element and the wire; and the above-described temporary protective film, wherein the temporary protective film is so that the adhesive layer of the temporary protective film is attached to a surface of the lead frame on the opposite side of the surface where the semiconductor element is mounted.

An aspect of the present invention relates to a method for manufacturing a semiconductor device, the method comprising a step of sticking the above-described temporary protective film to one surface of a lead frame having a die pad and an inner lead, in a direction in which the adhesive layer of the temporary protective film is in contact with the lead frame; a step of mounting a semiconductor element to a surface of the die pad on the opposite side of the temporary protective film; a step of providing a wire for connecting the semiconductor element and the inner lead; a step of forming an encapsulation layer encapsulating the semiconductor element and the wire to obtain an encapsulation molded body having the lead frame, the semiconductor element, and the encapsulation layer; and a step of detaching the temporary protective film from the encapsulation molded body, in this order.

The method for manufacturing a semiconductor device may further comprise a step of connecting the semiconductor element mounted on the die pad and the inner lead using an electroconductive material by reflow.

Advantageous Effects of Invention

According to the present invention, a temporary protective film for semiconductor encapsulation molding capable of suppressing conveyance failure on a stage in a process for manufacturing a semiconductor device, can be provided.

According to the temporary protective film for semiconductor encapsulation molding of the present invention, the possibility of the occurrence of jamming can be suppressed by suppressing conveyance failure. Therefore, when the temporary protective film for semiconductor encapsulation molding of the present invention is used, the productivity of semiconductor devices can be enhanced.

Furthermore, the temporary protective film for encapsulation molding of the present invention also has various characteristics required for semiconductor use applications, by which curling, and warpage of lead frames are suppressed.

DESCRIPTION OF EMBODIMENTS

In the following description, suitable embodiments of the present invention will be described in detail. However, the present invention is not limited to the following embodiments. The upper limit value and the lower limit value of a numerical value range described in the present specification can be arbitrarily combined. The numerical values described in the Examples can also be used as the upper limit values or the lower limit values of numerical value ranges.

Temporary Protective Film

Figure 1:
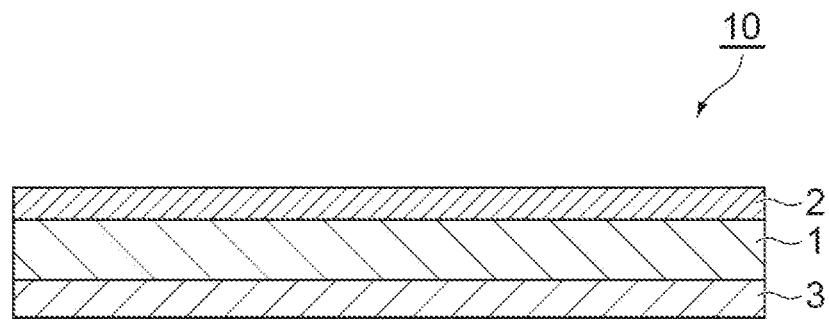
FIG. 1 is a cross-sectional view illustrating an embodiment of a temporary protective film.

FIG. 1 is a cross-sectional view illustrating a temporary protective film according to an embodiment. The temporary protective film 10 of FIG. 1 has a support film 1; an adhesive layer 2 provided on one principal surface of the support film 1; and a non-adhesive layer 3 (resin layer that is substantially not adhesive) provided on the other principal surface of the support film 1 while being in contact with the support film 1. The temporary protective film of these can be used, in an encapsulation molding step of forming an encapsulation layer that encapsulates a semiconductor element mounted on a lead frame, as a temporary protective film for semiconductor encapsulation molding for temporarily protect a lead frame during encapsulation molding, by sticking the temporary protective film to the back face (a surface on the opposite side of the surface where the semiconductor element is mounted) of the lead frame.

When the temporary protective film is attached to a lead frame having a die pad and an inner lead so that the adhesive layer is in contact with the lead frame, the 90° peel strength between the adhesive layer and the lead frame (peel strength after sticking) may be 5 N/m or more, 10 N/m or more, 50 N/m or more, 100 N/m or more, or 150 N/m or more, at 25° C. When the peel strength after sticking is 5 N/m or more at 25° C., the temporary protective film is not likely to be peeled off from the lead frame. In addition, a problem such as the encapsulation resin infiltrating between the lead frame and the adhesive layer during encapsulation molding, tends to be suppressed. The peel strength after sticking may be 2000 N/m or less, 1500 N/m or less, or 1000 N/m or less, at 25° C.

The peel strength after sticking is measured, for example, according to the 90° tear-off method of JIS Z 0237, by tearing off the temporary protective film in the 90° direction with respect to the lead frame. Specifically, the 90° peel strength when the temporary protective film is torn off at a rate of 270 to 330 mm per minute or 300 mm per minute at 25° C. is measured using a 90° peeling tester (manufactured by Tester Sangyo Co., Ltd.).

The peel strength after sticking depends on the glass transition temperature (Tg) of the adhesive layer, the adhesion temperature, the material of the adherend, wettability of the adhesive layer, and the like. Accordingly, the conditions can be appropriately selected while considering the glass transition temperature (Tg) of the adhesive layer, the adhesion temperature, the material of the lead frame, wettability of the adhesive layer, and the like so that the peel strength after sticking becomes 5 N/m or more. Among these, the glass transition temperature (Tg) of the adhesive layer and the sticking (adhesion) temperature largely affect the peel strength. Usually, an adhesion temperature higher by about 0° C. to 30° C. than the glass transition temperature (Tg) of the adhesive layer is employed. Appropriate conditions may be determined by taking into consideration of the material of the lead frame, the wettability of the adhesive layer, or the like.

The conditions for adhering the temporary protective film and a lead frame in order to measure the peel strength after sticking are not particularly limited; however, for example, the conditions for adhering the temporary protective film to a lead frame, which will be described below, may be employed. For example, sticking can be performed using a copper lead frame, a copper lead frame coated with palladium, or a lead frame made of Alloy 42 as the lead frame, under any of the adhesion conditions of: (1) a temperature of 230° C., a pressure of 6 MPa, and a duration of 10 seconds, (2) a temperature of 350° C., a pressure of 3 MPa, and a duration of 3 seconds, or (3) a temperature of 250° C., a pressure of 8 MPa, and a duration of 10 seconds.

Particularly, the 90° peel strength between the adhesive layer and the lead frame immediately before carrying out the encapsulation step may be 5 N/m or more, 10 N/m or more, or 50 N/m or more, at 25° C. When the 90° peel strength immediately before carrying out the encapsulation step is 5 N/m or more at 25° C., a problem such as the encapsulation resin infiltrating between the lead frame and the adhesive layer during the encapsulation step tends to be suppressed. Here, the phrase immediately before carrying out the encapsulation step means a time point before the encapsulation step, which is when all the steps to be carried out before the encapsulation step have been completed.

A heating step of heating the temporary protective film-attached lead frame may be carried out after the temporary protective film is attached or adhered to the lead frame, and before the encapsulation step is carried out. As a result, the adhesive strength between the adhesive layer and the lead frame can be enhanced. The heating temperature in the heating step is not particularly limited; however, in order to enhance the adhesive strength between the adhesive layer and the lead frame, the heating temperature may be 100° C. or higher. The heating temperature may be 400° C. or lower from the viewpoint of the heat resistance of the lead frame and the temporary protective film. For similar reasons, the heating temperature may be from 130° C. to 350° C. The heating time is not particularly limited; however, in order to sufficiently enhance the adhesive strength between the adhesive layer and the lead frame, the heating time may be 10 seconds or more. For similar reasons, the heating time may be from 1 minute to 2 hours.

From the viewpoint of productivity, the above-described heating step may be carried out by heating in various steps before moving to the encapsulation step (for example, a curing step for an adhesive such as a silver paste (semiconductor element adhesion step), a reflow connection step, and a wire bonding step). For example, as described above, in the semiconductor element adhesion step, usually, heating is performed at 140° C. to 200° C. for 30 minutes to 2 hours in order to cure the adhesive used for adhesion. Therefore, the above-described heating step can be carried out by heating in these various steps.

When the temporary protective film is attached to a lead frame so that the adhesive layer is in contact with the lead frame, a semiconductor element is mounted on a surface of the die pad, the surface being on the opposite side of the temporary protective film, and an encapsulation layer that encapsulates the semiconductor element is formed to be in contact with the adhesive layer, the 90° peel strength between the adhesive layer and the lead frame as well as the encapsulation layer (hereinafter, also referred to as "peel strength after encapsulation") may be 1000 N/m or less, 800 N/m or less, or 500 N/m or less, in at least a portion of the temperature range of 0° C. to 250° C. When the peel strength after encapsulation is 1000 N/m or less, a problem that the lead frame and the encapsulation layer are damaged when subjected to stress, tends to be suppressed. The peel strength after encapsulation usually decreases as the measurement temperature rises. The peel strength after encapsulation may be 0 N/m or more, 3 N/m or more, or 5 N/m or more, in at least a portion of the temperature range of 0° C. to 250° C.

The peel strength after encapsulation may be in the above-mentioned range in at least a portion of the temperature range of 80° C. to 250° C. and may be in the above-mentioned range at the temperature adopted when the temporary protective film is detached from the lead frame and the encapsulation layer.

The peel strength after encapsulation is measured according to the 90° tear-off method of JIS Z 0237, by tearing off the temporary protective film in the 90° direction with respect to lead frame and the encapsulation layer at room temperature or on a stage of 0° C. to 250° C. Specifically, the 90° peel strength at the time of tearing off the temporary protective film at a rate of 270 to 330 mm per minute or 300 mm per minute in at least a portion of the temperature of 0° C. to 250° C. is measured using a 90° peeling tester (manufactured by Tester Sangyo Co., Ltd.). The temperature range for measuring this peel strength may be 80° C. to 240° C., or 140° C. to 230° C.

The temperature (temperature of the temporary protective film) at the time of tearing off the temporary protective film from the lead frame and the encapsulation layer may be usually from 0° C. to 250° C. There are no particular limitations on the conditions for encapsulation using an encapsulant for measuring the peel strength after encapsulation in at least a portion of the temperature range of 0° C. to 250° C. However, the conditions may be conditions for forming an encapsulation layer in the method for manufacturing a semiconductor device, which will be described below. The formation of an encapsulation layer may include, for example, forming an encapsulation layer using CEL-9200 (trade name, a biphenyl encapsulant manufactured by Hitachi Chemical Co., Ltd.) under the conditions of a temperature of 180° C., a pressure of 10 MPa, and a duration of 3 minutes; and curing the encapsulant forming the encapsulation layer by heating at 180° C. for 5 hours.

Adhesive Layer

The adhesive layer may contain a resin. The resin used for forming the adhesive layer (hereinafter, also referred to as "resin (a)") may be a thermoplastic resin having an amide group (—NHCO—), an ester group (—CO—O—), an imide group (—NR$_2$, provided that each R is —CO—), an ether group (—O—), or a sulfone group (—SO$_2$—). The resin (a) may be a thermoplastic resin having an amide group, an ester group, an imide group, or an ether group. Specific examples of the resin (a) include an aromatic polyamide, an aromatic polyester, an aromatic polyimide, an aromatic polyamideimide, an aromatic polyether, an aromatic polyetheramideimide, an aromatic polyetheramide, an aromatic polyesterimide, and an aromatic polyetherimide. From the viewpoints of heat resistance and adhesiveness, the resin (a) may be at least one selected from the group consisting of an aromatic polyetheramideimide, an aromatic polyetherimide, and an aromatic polyetheramide.

The resin (a) can be produced by, for example, polycondensing an aromatic diamine, a bisphenol, or the like as a base component and a dicarboxylic acid, a tricarboxylic acid, a tetracarboxylic acid, an aromatic chloride, or a reactive derivative of any one of these. That is, the production can be carried out by any conventional method used for a reaction between an amine and an acid, and there are also no particular limitations on the various conditions and the like. For the polycondensation reaction of an aromatic dicarboxylic acid, an aromatic tricarboxylic acid, or a reactive derivative of one of these and a diamine, any conventional method is used.

The aromatic polyetherimide, the aromatic polyetheramideimide, and the aromatic polyetheramide may contain a constituent unit derived from a base component used for the synthesis of these polymers. Examples of the base component include an aromatic diamine having an ether group, such as 2,2-bis[4-(4-aminophenoxy)phenyl]propane, bis[4-(4-aminophenoxy)phenyl]sulfone, 4,4'-diaminodiphenyl ether, bis[4-(4-aminophenoxy)phenyl] ether, or 2,2-bis[4-(4-aminophenoxy)]hexafluoropropane; an aromatic diamine that does not have an ether group, such as 4,4'-methylenebis(2,6-diisopropylamine); a siloxanediamine such as 1,3-bis(3-aminopropyl)-tetramethyldisiloxane; and an α,ω-diaminoalkane such as 1,12-diaminododecane or 1,6-diaminohexane. Based on the total amount of the base component, the proportion of the aromatic diamine having an ether group may be an amount equivalent to 40 mol % to 100 mol %, or 50 mol % to 97 mol %, and the proportion of at least one selected from the aromatic diamine that does not have an ether group, a siloxanediamine, and an α,ω-diaminoalkane may be an amount equivalent to 0 mol % to 60 mol %, or 3 mol % to 50 mol %. Examples of a combination of the base components include: (1) a combination of base components including 60 mol % to 89 mol % or 68 mol % to 82 mol % of an aromatic diamine having an ether group, 1 mol % to 10 mol % or 3 mol % to 7 mol % of a siloxanediamine, and 10 mol % to 30 mol % or 15 mol % to 25 mol % of an α,ω-daminoalkane; (2) a combination of base components including 90 mol % to 99 mol % or 93 mol % to 97 mol % of an aromatic diamine having an ether group, and 1 mol % to 10 mol % or 3 mol % to 7 mol % of a siloxanediamine; and (3) a combination of base components including 40 mol % to 70 mol % or 45 mol % to 60 mol % of an aromatic diamine having an ether group, and 30 mol % to 60 mol % or 40 mol % 55 mol % of an aromatic diamine that does not have an ether group.

The aromatic polyetherimide, the aromatic polyetheramideimide, and the aromatic polyetheramide may contain a constituent unit derived from an acid component, which is used for the synthesis of these polymers. Examples of the acid component include (A) trimellitic anhydride, a reactive derivative of trimellitic anhydride such as trimellitic anhydride chloride, a mononuclear aromatic tricarboxylic acid anhydride such as pyromellitic dianhydride, or a mononuclear aromatic tetracarboxylic acid dianhydride, (B) a polynuclear aromatic tetracarboxylic dianhydride such as bisphenol A bistrimellitate dianhydride or oxydiphthalic anhydride, and (C) an aromatic dicarboxylic acid such as a reactive derivative of phthalic acid, such as terephthalic acid, isophthalic acid, terephthalic acid chloride, or isophthalic acid chloride. The aromatic polyetheramide may be a product obtained by, for example, reacting 0.95 to 1.05 mol or 0.98 to 1.02 mol of the acid component (A) per 1 mol of the above-mentioned base component (1) or (2). The aromatic polyetherimide may be a product obtained by, for example, reacting 0.95 to 1.05 mol or 0.98 to 1.02 mol of the acid component (B) per 1 mol of the above-mentioned base component (3).

The adhesive layer may contain a filler such as ceramic powder, glass powder, silver powder, copper powder, resin particles, or rubber particles; a coupling agent, and the like. When the adhesive layer contains a filler, the content of the filler may be 1 to 30 parts by weight or 5 to 15 parts by weight with respect to 100 parts by weight of the resin (a).

Examples of the coupling agent include vinylsilane, epoxysilane, mercaptosilane, a titanate, an aluminum chelate, a zircoaluminate, or a combination of these. The coupling agent may be a silane coupling agent. Examples of the silane coupling agent include vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropyltrimethoxysilane, and 3-mercaptopropyltrimethoxysilane. The silane coupling agent may also be an epoxysilane coupling agent having an epoxy group. When the adhesive layer contains a silane coupling agent, the close adhesiveness of the adhesive layer to the support film can be enhanced, and as a result, when the temporary protective film is torn off, detachment is not likely to occur at the interface between the adhesive layer and the support film. The content of the coupling agent may be 1 to 15 parts by weight or 2 to 10 parts by weight with respect to 100 parts by weight of the resin (a).

From the viewpoints of adhesiveness and heat resistance, the glass transition temperature of the adhesive layer may be 100° C. to 300° C., 130° C. to 280° C., or 150° C. to 250° C. In a case where the glass transition temperature is 100° C. or higher, when the temporary protective film is torn off from the lead frame and the encapsulant, peeling is not likely to occur at the interface between the adhesive layer and the support film, and there is a tendency that the adhesive layer is not likely to undergo cohesive fracture. Furthermore, in the wire bonding step, the adhesive layer is not excessively softened, dispersion of force at the time of wire connection is suppressed, and there is a tendency that connection failure of the wire is not likely to occur. When the glass transition temperature is 300° C. or lower, since the adhesive layer is sufficiently softened at the time of adhesion, a decrease in the 90° peel strength between the adhesive layer and the lead frame at 25° C. tends to be suppressed. Therefore, detachment in the conveyance step, a leak in the encapsulant at the time of encapsulation, and the like are not likely to occur.

The 5% weight reduction temperature of the adhesive layer may be 300° C. or higher, 350° C. or higher, or 400° C. or higher. When the 5% weight reduction temperature of the adhesive layer is 300° C. or higher, outgassing caused by the heat generated at the time of sticking the temporary protective film to a lead frame, and/or the heat generated in the wire bonding step is not likely to occur, and there is a tendency that the lead frame and the wire are not likely to be contaminated. The 5% weight reduction temperature of the adhesive layer can be determined by measuring the temperature at a rate of temperature increase of 10° C./min using a differential thermal balance (manufactured by Seiko Instruments, Inc., TG/DTA220).

The elastic modulus at 230° C. of the adhesive layer may be 1 MPa or more, or 3 MPa or more. The wire bonding temperature is not particularly limited; however, the wire bonding temperature is generally about 180° C. to 260° C. and is frequently approximately 230° C. Therefore, when the elastic modulus at 230° C. is 1 MPa or more, the adhesive layer is not excessively softened by the heat generated in the wire bonding step, and there is a tendency that connection failure of wire is not likely to occur. The upper limit of the elastic modulus at 230° C. of the adhesive layer is not particularly limited; however, the upper limit may be 2000 MPa or less, 1500 MPa or less, or 1000 MPa or less. The elastic modulus at 230° C. of the adhesive layer is measured in a tensile mode with a sine wave at a rate of temperature increase of 5° C./min and a frequency of 10 Hz by setting the distance between chucks to 20 mm in a dynamic viscoelasticity analyzer (manufactured by UBM Co., Ltd., Rheogel-E4000).

The thickness (A) of the adhesive layer may be 1 to 20 µm, 3 to 15 µm, or 4 to 10 µm. When the thickness (A) of the adhesive layer is 1 µm or more, the adhesive layer has superior adhesiveness, and there is a tendency that the encapsulant is not likely to leak during encapsulation. When the thickness (A) of the adhesive layer is 20 µm or less, the economic efficiency tends to be superior.

Support Film

The support film is not particularly limited; however, the support film may be a film including a resin that can endure heat (heat-resistant resin) during application and drying of the resin used for forming the adhesive layer or the non-adhesive layer and during a semiconductor device assembling process. The support film may be, for example, a film of at least one polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, a polyallylate, an aromatic polyether ether ketone, and polyethylene naphthalate, that is, a film containing the polymer.

The glass transition temperature of the support film may be 200° C. or higher, or 250° C. or higher, in order to enhance heat resistance. By using a film of the above-described polymer, the support film is not softened during a process of applying heat, such as a step of adhering a semiconductor element to a die pad, a wire bonding step, an encapsulation step, or a step of tearing off the temporary protective film from the encapsulation molded body, and the operation can be carried out efficiently.

In order to reduce the warpage of the lead frame occurring after sticking the temporary protective film to the lead frame, the coefficient of linear expansion at 20° C. to 200° C. of the support film may be $3.0 \times 10^{-5}/°$ C. or less, $2.5 \times 10^{-5}/°$ C. or less, or $2.0 \times 10^{-5}/°$ C. or less. The coefficient of linear expansion at 20° C. to 200° C. of the support film is performed according to JIS K 7197. The measurement is performed using a thermomechanical analysis apparatus (TMA). The distance between chucks is set to 20 mm, and the coefficient of thermal expansion at 20° C. to 200° C. is calculated.

In order to reduce the warpage of the lead frame occurring after sticking the temporary protective film to the lead frame, the coefficient of thermal shrinkage at the time of heating the support film at 200° C. for 2 hours may be 0.15% or less, 0.13% or less, or 0.10% or less. Measurement of the coefficient of thermal shrinkage can be carried out according to JIS K 7133. For the measurement of the coefficient of thermal shrinkage, a universal measuring microscope MF-U manufactured by Mitutoyo Corporation is used. The coefficient of thermal shrinkage can be determined by measuring the difference of the dimensions in the MD direction (longitudinal direction) or the TD direction (direction perpendicular to the MD direction) of the support film before and after a heat treatment. The conditions for the heat treatment are a temperature of 200° C. and a duration of 2 hours. The coefficient of thermal shrinkage is a measured value in any direction whichever gives a larger value between the MD direction and the TD direction.

The support film may be a film having sufficiently high close adhesiveness to the adhesive layer. In a case where the close adhesiveness is high, when the temporary protective film is torn off from the lead frame and the encapsulant at a temperature of 100° C. to 300° C., detachment is not likely to occur at the interface between the adhesive layer and the support film, and the resin is not likely to remain in the lead frame and the encapsulant. The support film may be a polyimide film from the viewpoints of the heat resistance and the close adhesiveness to the adhesive layer.

The support film may be subjected to a surface treatment in order to sufficiently increase the close adhesiveness to the adhesive layer. The method for performing a surface treatment on the support film is not particularly limited; however, examples include a chemical treatment such as an alkali treatment or a silane coupling treatment a physical treatment such as a sand mat treatment; a plasma treatment; and a corona treatment.

The thickness of the support film is not particularly limited; however, the thickness may be 5 to 100 µm, or 5 to 50 µm or less. When the thickness of the support film is 5 µm or more, workability tends to be high because creases are not likely to be generated in the temporary protective film. When the thickness of the support film is 100 µm or less, there is a tendency that the warpage of the lead frame occurring after sticking the temporary protective film to the lead frame is likely to be suppressed.

The material of the support film may be a metal selected from the group consisting of copper, aluminum, stainless steel, and nickel. When the support film contains these metals, the coefficients of linear expansion of the lead frame and the support film become close to each other, and therefore, the warpage of the lead frame occurring after sticking the temporary protective film to the lead frame can be reduced.

The ratio $T_2/T_1$ of the thickness $T_2$ of the adhesive layer to the thickness $T_1$ of the support film may be 0.5 or less, 0.3 or less, or 0.2 or less. When the $T_2/T_1$ is 0.5 or less, curling of the film caused by volume reduction of the adhesive layer at the time of solvent removal after application is suppressed, and the workability at the time of sticking the support film to the lead frame tends to be high.

Non-Adhesive Layer

The non-adhesive layer is a resin layer that substantially does not have adhesiveness (or pressure-sensitive adhesiveness) to the lead frame at 0° C. to 270° C. When the temporary protective film comprises a non-adhesive layer, curling of the temporary protective film attributable to the volume reduction of the adhesive layer at the time of solvent removal, or the volume reduction of the adhesive layer caused by shrinkage at the time of imidization or at the time of curing of a thermosetting resin can be canceled.

The non-adhesive layer may be a resin layer that is not likely to be softened at high temperature, and for example, a resin layer having a high glass transition temperature can function as the non-adhesive layer.

The non-adhesive layer may contain a resin. The composition of the resin (hereinafter, also referred to as "resin (b)") used for forming the non-adhesive layer is not particularly limited; however, the resin may be either a thermoplastic resin or a thermosetting resin. The thermoplastic resin is not particularly limited but may be a thermoplastic resin having at least one functional group selected from the group consisting of an amide group, an ester group, an imide group, an ether group, and a sulfone group. The thermosetting resin is not particularly limited but may be, for example, an epoxy resin, a phenol resin, or a bismaleimide resin (for example, a bismaleimide resin containing bis(4-maleimidophenyl) methane as a monomer). It is also acceptable to combine a thermoplastic resin and a thermosetting resin. In the case of combining a thermoplastic resin and a thermosetting resin, the amount of the thermosetting resin may be 5 to 100 parts by mass, or 20 to 70 parts by mass, with respect to 100 parts by mass of the thermoplastic resin.

The non-adhesive layer may contain a filler such as ceramic powder, glass powder, silver powder, copper powder, resin particles, or rubber particles; a coupling agent, and the like. When the non-adhesive layer contains a filler, the content of the filler may be 1 to 30 parts by mass or may be 5 to 15 parts by mass, with respect to 100 parts by mass of the resin (b). The content of the coupling agent may be 1 to 20 parts by mass or may be 2 to 15 parts by mass, with respect to 100 parts by mass of the resin (b).

The elastic modulus at 230° C. of the non-adhesive layer may be 10 MPa or more, 100 MPa or more, or 1000 MPa or more. When the elastic modulus at 230° C. of the non-adhesive layer is 10 MPa or more, the non-adhesive layer is not likely to be softened in a step where heat is applied, such as a wire bonding step, and therefore, there is a tendency that the non-adhesive layer is not likely to adhere to a mold and a jig. The elastic modulus at 230° C. of the non-adhesive layer may be 2000 MPa or less or 1500 MPa or less.

The elastic modulus at 230° C. of the non-adhesive layer can be measured in a tensile mode with a sine wave at a rate of temperature increase of 5° C./min and a frequency of 10 Hz, using a dynamic viscoelasticity measuring apparatus (manufactured by UBM Co., Ltd., Rheogel-E4000) by setting the distance between chucks to 20 mm.

The adhesive force of the non-adhesive layer to a mold and a jig is not particularly limited when the adhesive force is low to the extent that the non-adhesive layer does not stick to the mold and/or jig; however, the 90° peel strength between the non-adhesive layer and the mold as well as the jig at 25° C. may be less than 5 N/m or less than 1 N/m. This peel strength is measured, for example, after the non-adhesive layer is compressed against a mold made of brass at a temperature of 250° C. and a pressure of 8 MPa for 10 seconds.

The glass transition temperature of the non-adhesive layer may be 150° C. or higher, 200° C. or higher, or 250° C. or higher, in order to make it difficult for the non-adhesive layer to be softened in a step of adhering a semiconductor element to a die pad, a wire bonding step, an encapsulation step, a step of tearing off the temporary protective film from an encapsulation molded boy, or the like, and to make it difficult for the non-adhesive layer to adhere to a mold and a jig. The glass transition temperature of the non-adhesive layer may be 350° C. or lower or 300° C. or lower.

The thickness of the non-adhesive layer may be, for example, 10 μm or less, 9 μm or less, 8 μm or less, or 7 μm or less. The thickness of the non-adhesive layer may be, for example, 1 μm or more, 2 μm or more, 3 μm or more, 4 μm or more, 5 μm or more, or 6 μm or more. The thickness of the non-adhesive layer is not particularly limited; however, for example, the thickness may be 1 to 10 μm or 1 to 8 μm.

The surface roughness Ra of a surface of the non-adhesive layer, the surface being on the opposite side of the surface in contact with the support film, is 0.1 μm and may be 0.15 μm or more or 0.2 μm or more. The surface roughness Ra as used herein is a value measured by a laser microscope under a condition in which a magnification ratio of an object lens of 50 times. The surface roughness Ra can be determined by, for example, an analysis of an image obtained by linking images of 11 sections in the vertical direction and 9 sections in the horizontal direction. When the surface roughness Ra is 0.1 μm or more, the non-adhesive layer exhibits excellent sliding with a stage in the apparatus, is not likely to cause jamming defects, exhibits excellent sliding between lead frames to which the temporary protective film is attached, and is not likely to cause a problem that the non-adhesive layer adheres and is not peeled off. The surface roughness Ra can be measured with a shape measuring laser microscope VK-X100 manufactured by Keyence Corporation, which is a laser microscope. The surface roughness (Ra) of a surface of the non-adhesive layer, the surface being on the opposite side of the surface in contact with the support film, may be, for example, 3 μm or less, 2 μm or less, or 1 μm or less. From the viewpoint such as described above, when the surface roughness Ra is measured by a laser microscope under the conditions of a magnification ratio of the object lens of 10 times, the surface roughness Ra of a surface of the non-adhesive layer, the surface being on the opposite side of the surface in contact with the support film, may be 0.4 μm or more, 0.5 μm or more, or 0.6 μm or more and may be 8 μm or less or 6 μm or less.

Method for Manufacturing Temporary Protective Film

The temporary protective film according to an embodiment includes, for example, dissolving the resin (a) used for forming an adhesive layer in a solvent such as N-methyl- 2-pyrrolidone, dimethylacetamide, diethylene glycol dimethyl ether, tetrahydrofuran, cyclohexanone, methyl ethyl ketone, or dimethylformamide to prepare an adhesive varnish; applying the adhesive varnish on one surface of a support film; and removing the solvent from the applied adhesive varnish by heating to form an adhesive layer. A temporary protective film having a bilayer structure can be obtained by this method. The method for forming a temporary protective film may also include preparing a precursor varnish in which a resin (a) precursor (for example, polyamic acid) that produces the resin (a) (for example, a polyimide resin) by a heating treatment or the like is dissolved in a solvent; applying the precursor varnish on one surface of a support film; and subjecting the applied precursor varnish to a heating treatment to form an adhesive layer including the resin (a). A temporary protective film having a bilayer structure can be obtained by this method. In the case of using a resin (a) precursor, the solvent is removed by a heating treatment after application, and at the same time, the resin (a) is produced from the precursor by, for example, imidization. From the viewpoint of the surface state of the applied surface or the like, an adhesive varnish may also be used.

When the support film having the above-described varnish applied thereon is subjected to a heating treatment for the purpose of removing the solvent, imidization, and the like, the temperature of the heating treatment may vary depending on whether an adhesive varnish is used, or whether a precursor varnish is used. In the case of an adhesive varnish, the temperature may be a temperature at which the solvent can be removed, and in the case of a precursor varnish, the temperature may be a treatment temperature equal to or higher than the glass transition temperature of the adhesive layer in order to perform imidization.

There are no particular limitations on the application method for the adhesive varnish or the precursor varnish, which is applied on one surface of the support film. For example, the varnish can be applied by using roll coating, reverse roll coating, gravure coating, bar coating, or comma coating. These varnishes may also be applied by a method of passing the support film through the adhesive varnish or the precursor varnish.

The method for forming the non-adhesive layer is not particularly limited and includes dissolving the resin (b) in a solvent such as N-methyl-2-pyrrolidone, dimethylacetamide, diethylene glycol dimethyl ether, tetrahydrofuran, cyclohexanone, methyl ethyl ketone, or dimethylformamide to prepare a resin varnish; applying the resin varnish on the support film; and removing the solvent from the applied resin varnish by heating. The method for forming the non-adhesive layer may include dissolving a resin (b) precursor (for example, polyamic acid) that produces the resin (b) (for example, a polyimide resin) by heating or the like in a solvent to prepare a precursor varnish; applying the precursor varnish on a support film or the like; and heating the applied precursor varnish. In this case, as a result of the heating treatment after application, the solvent is removed, and at the same time, the resin (b) is produced from the precursor by, for example, imidization. From the viewpoint of the surface state of the coating film, a resin varnish may also be used.

When the support film having the above-described varnish applied thereon is subjected to a heating treatment for the purpose of removing the solvent, imidization, and the like, the temperature for the heating treatment may vary depending on whether a resin varnish is used, or whether a precursor varnish is used. In the case of using a resin varnish, the temperature may be a temperature at which the solvent can be removed, and in the case of using a precursor varnish, the temperature may be a treatment temperature equal to or higher than the glass transition temperature of the non-adhesive layer in order to perform imidization.

There are no particular limitations on the application method for the adhesive varnish or the precursor varnish of the resin (b) on the support film. For example, the varnish can be applied by using roll coating, reverse roll coating, gravure coating, bar coating, or comma coating. These varnishes may also be applied by a method of passing the support film through the adhesive varnish or the precursor varnish.

Method for Manufacturing Semiconductor Device

A semiconductor device can be produced by a method including an encapsulation molding step of a semiconductor element using the temporary protective film according to an embodiment. The semiconductor device is produced by, for example, detaching the temporary protective film from a temporary protective film-attached semiconductor device that comprises a temporary protective film; a lead frame adhered to be in contact with the adhesive layer of the temporary protective film; a semiconductor element adhered to the die pad of the lead frame; an electroconductive material such as a wire or a metal plate for connecting the semiconductor element to the inner lead of the lead frame; and an encapsulation layer that encapsulates the exposed surface of the lead frame, the semiconductor element, and the wire.

The semiconductor device that is manufactured may be, for example, a Non Lead Type Package which has a lead frame, a semiconductor element mounted on this lead frame, and an encapsulation layer that encapsulates the semiconductor element on the semiconductor element side of the lead frame, and in which the back face of the lead frame is exposed for external connection. Specific examples thereof include QFN (QuadFlat Non-leaded Package) and SON (Small Outline Non-leaded Package).

Figure 2:
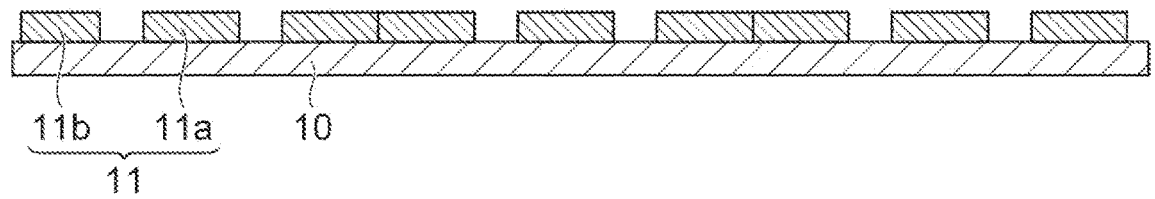
FIG. 2 is a cross-sectional view illustrating an embodiment of a method for manufacturing a semiconductor device.
Figure 3:
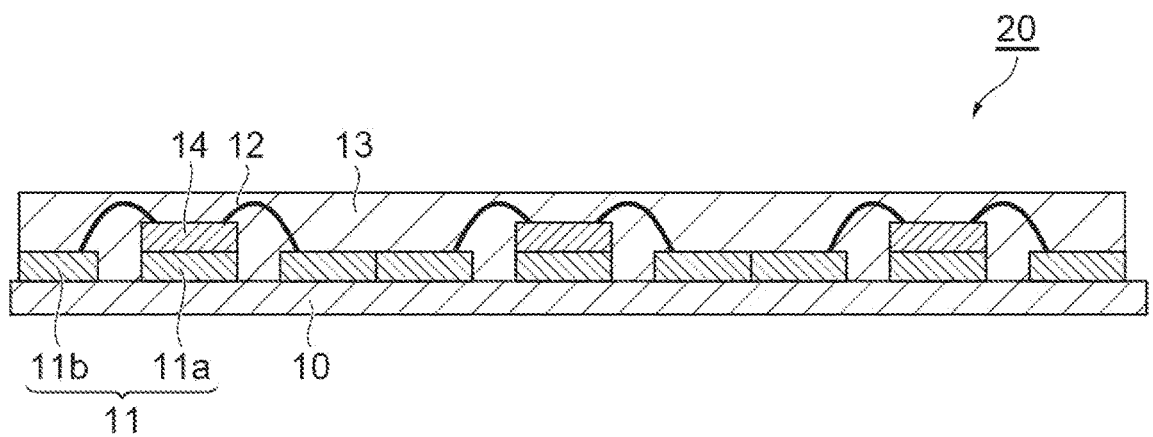
FIG. 3 is a cross-sectional view illustrating an embodiment of the method for manufacturing a semiconductor device.
Figure 4:
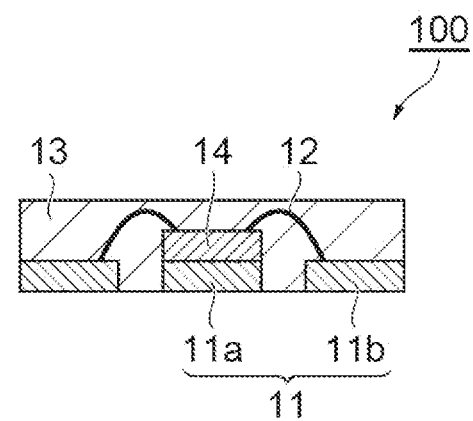
FIG. 4 is a cross-sectional view illustrating an embodiment of a semiconductor device.

FIGS. 2 and 3 are cross-sectional views illustrating a method for manufacturing a semiconductor device according to an embodiment. FIG. 4 is a cross-sectional view illustrating an embodiment of the semiconductor device obtainable by the manufacturing method of FIGS. 2 and 3. In the following description, each step will be described with reference to each of the drawings as necessary.

The method for manufacturing a semiconductor device according to embodiments comprises a step of sticking a temporary protective film 10 to one surface (back face) of a lead frame 11 having a die pad 11a and an inner lead 11b, in such a direction that the adhesive layer of the temporary protective film 10 is in contact with the lead frame; a step of mounting (adhering) a semiconductor element 14 on a surface of the die pad 11a, the surface being on the opposite side of the temporary protective film 10; a step of providing a wire 12 that connects the semiconductor element 14 and the inner lead 11b; a step of forming an encapsulation layer 13 that encapsulates the semiconductor element 14 and the wire 12 to obtain an encapsulation molded body 20 having the lead frame 11, the semiconductor element 14, and the encapsulation layer 13; and a step of detaching the temporary protective film 10 from the encapsulation molded body 20, in this order.

Sticking of the temporary protective film 10 to the lead frame 11 may be carried out under heating or may be carried out at normal temperature (for example, 5° C. to 35° C.). The method of sticking is not particularly limited but may be, for example, a roll lamination method. The temporary protective film-attached lead frame according to an embodiment comprises a lead frame 11 having a die pad 11*a* and an inner lead 11*b*; and a temporary protective film 10. The temporary protective film 10 is attached to the lead frame 11 so that the adhesive layer 2 of the temporary protective film 10 is in contact with one surface of the lead frame 11.

The conditions for adhesion of the temporary protective film 10 to the lead frame 11 are not particularly limited; however, the adhesion temperature may be 150° C. to 400° C., 180° C. to 350° C., or 200° C. to 300° C. When the adhesive temperature is 150° C. or higher, the adhesive strength between the lead frame 11 and the adhesive layer 2 tends to be further enhanced. When the adhesion temperature is 400° C. or lower, deterioration of the lead frame 11 tends to be further suppressed.

The adhesion pressure of the temporary protective film 10 to the lead frame 11 may be 0.5 to 30 MPa, 1 to 20 MPa, or 3 to 15 MPa. When the adhesion pressure is 0.5 MPa or higher, the adhesive strength between the adhesive layer 2 and the lead frame 11 tends to be further enhanced. When the adhesion pressure is 30 MPa or less, there is a tendency that damage of the lead frame 11 is likely to be further suppressed.

The adhesion time for the temporary protective film 10 to the lead frame 11 may be 0.1 to 60 seconds, 1 to 30 seconds, or 3 to 20 seconds. When the adhesion time is 0.1 seconds or more, there is a tendency that the adhesive strength between the adhesive layer 2 and the lead frame 11 is likely to be further enhanced. When the adhesion time is 60 seconds or less, there is a tendency that workability and productivity are likely to be further enhanced. Before pressure is applied, preliminary heating for about 5 to 60 seconds may be carried out.

The material for the lead frame 11 is not particularly limited; however, for example, the material may be an iron-based alloy such as Alloy 42, copper, or a copper-based alloy. When copper and a copper alloy are used, a coating treatment with palladium, gold, silver, or the like may be applied to the surface of the lead frame.

The semiconductor element 14 is usually mounted (adhered) on the die pad 11*a*, with an adhesive (for example, silver paste) interposed therebetween. The adhesive may be cured by a heating treatment (for example, 140° C. to 200° C., 30 minutes to 2 hours).

After the semiconductor element is mounted (adhered), the semiconductor element and the inner lead may be connected by solder reflow using an electroconductive material such as a copper plate. That is, the method for manufacturing a semiconductor device may further comprise a step of connecting the semiconductor element mounted on the die pad to the inner lead using an electroconductive material by reflow. The connection by reflow may be carried out, for example, at a maximum temperature in the temperature range of 250° C. to 420° C. under the conditions of 1 to 30 minutes. The connection by reflow is carried out, for example, before the step of obtaining the encapsulation molded body 20 and after the step of mounting (adhering) the semiconductor element 14. The connection by reflow may also be carried out, for example, after the step of mounting (adhering) the semiconductor element 1 and before the step of providing the wire 12.

The wire 12 is not particularly limited; however, the wire 12 may be, for example, a gold wire, a copper wire, a palladium-coated copper wire, or an aluminum wire. For example, the semiconductor element and the inner lead may be joined by the wire 12 by heating at 200° C. to 300° C. for 3 minutes to 3 hours.

In the step of encapsulation molding, an encapsulation layer 13 is formed using an encapsulant. An encapsulation molded body 20 having a plurality of semiconductor elements 14 and an encapsulation layer 13 encapsulating those in a lump by encapsulation molding is obtained. During encapsulation molding, since the temporary protective film 10 is provided, the encapsulant wrapping around the back face side of the lead frame 11 is suppressed.

The temporary protective film-attached encapsulation molded body according to an embodiment comprises a lead frame 11 having a die pad 11*a* and an inner lead 11*b*; a semiconductor element 14 mounted on the die pad 11*a*; a wire 12 connecting the semiconductor element 14 and the inner lead 11*b*; an encapsulation layer 13 encapsulating the semiconductor element 14 and the wire 12; and a temporary protective film 10. The temporary protective film 10 is attached to the lead frame 11 so that the adhesive layer 2 of the temporary protective film 10 is attached to a surface of the lead frame 11 on the opposite side of the surface where the semiconductor element 14 is mounted.

The temperature during the process of forming the encapsulation layer 13 (encapsulation temperature) may be, for example, 150° C. to 200° C. The pressure during the process of forming the encapsulation layer (encapsulation pressure) may be 6 to 15 MPa or 7 to 10 MPa. The heating time for encapsulation molding (encapsulation time) may be 1 to 5 minutes or 2 to 3 minutes.

The formed encapsulation layer 13 may be heated and cured as necessary. The heating temperature for curing the encapsulation layer 13 (encapsulation curing temperature) may be 150° C. to 200° C. The heating time for curing the encapsulation layer 13 (encapsulation curing time) may be, for example, 4 to 6 hours.

The encapsulant is not particularly limited; however, the encapsulant may be, for example, a curable resin composition including an epoxy resin such as a cresol novolac epoxy resin, a phenol novolac epoxy resin, a biphenyl diepoxy resin, or a naphthol novolac epoxy resin. The encapsulant may contain, for example, additive materials such as a filler, a flame retardant substance such as a bromine compound, and a wax component.

After the encapsulation layer 13 is formed (encapsulation molding), the temporary protective film 10 is detached from the lead frame 11 and the encapsulation layer 13 of the obtained encapsulation molded body 20. When the encapsulation layer is cured, the temporary protective film 10 may be detached at any time point before or after the curing of the encapsulation layer 13.

The temperature at which the temporary protective film 10 is detached from the encapsulation molded body (detachment temperature) may be between 0° C. and 250° C. When the detachment temperature is 0° C. or higher, the adhesive layer is less likely to remain on the lead frame 11 and the encapsulation layer 13. When the detachment temperature is 250° C. or lower, there is a tendency that deterioration of the lead frame 11 and the encapsulation layer 13 is likely to be further suppressed. For similar reasons, the detachment temperature may be 80° C. to 240° C., or 140° C. to 230° C.

The method for manufacturing a semiconductor device may further include a step of removing the adhesive layer (adhesive residue) remaining on the lead frame 11 and the encapsulation layer 13 after the detachment step, as necessary. When the temporary protective film 10 is torn off at 0° C. to 250° C. after being encapsulated with an encapsulant, the adhesive layer 2 may not remain on the lead frame 11 and the encapsulation layer 13. When the residual amount of the adhesive layer is large, not only the external appearance is poor, but also the residue is likely to cause connection failure when the lead frame 11 is used for external connection. Therefore, the adhesive layer remaining on the lead frame 11 and the encapsulation layer 13 may be removed by mechanical brushing or with a solvent or the like. The solvent is not particularly limited, and the solvent may be N-methyl-2-pyrrolidone, dimethylacetamide, diethylene glycol dimethyl ether, tetrahydrofuran, cyclohexanone, methyl ethyl ketone, dimethylformamide, or a combination of these.

When the lead frame has a plurality of patterns each having a die pad and an inner lead, a plurality of the semiconductor devices 100 of FIG. 4 each having one semiconductor element can be obtained by dividing the encapsulation molded body 20 as necessary.

That is, when the lead frame 11 has a plurality of die pads 11a, and a semiconductor element 14 is mounted on each of a plurality of the die pads 11a, the manufacturing method according to an embodiment may further comprise a step of dividing the encapsulation molded body 20 before or after detaching the temporary protective film 10 from the encapsulation molded body 20 to obtain semiconductor devices 100 each having one die pad 11a and a semiconductor element 14.

The semiconductor device may also be manufactured by winding a long temporary protective film around a winding core and unwinding the temporary protective film from the obtained reel body. The reel body in this case has a winding core and a temporary protective film according to the above-mentioned embodiments wound around the winding core.

Figure 6:
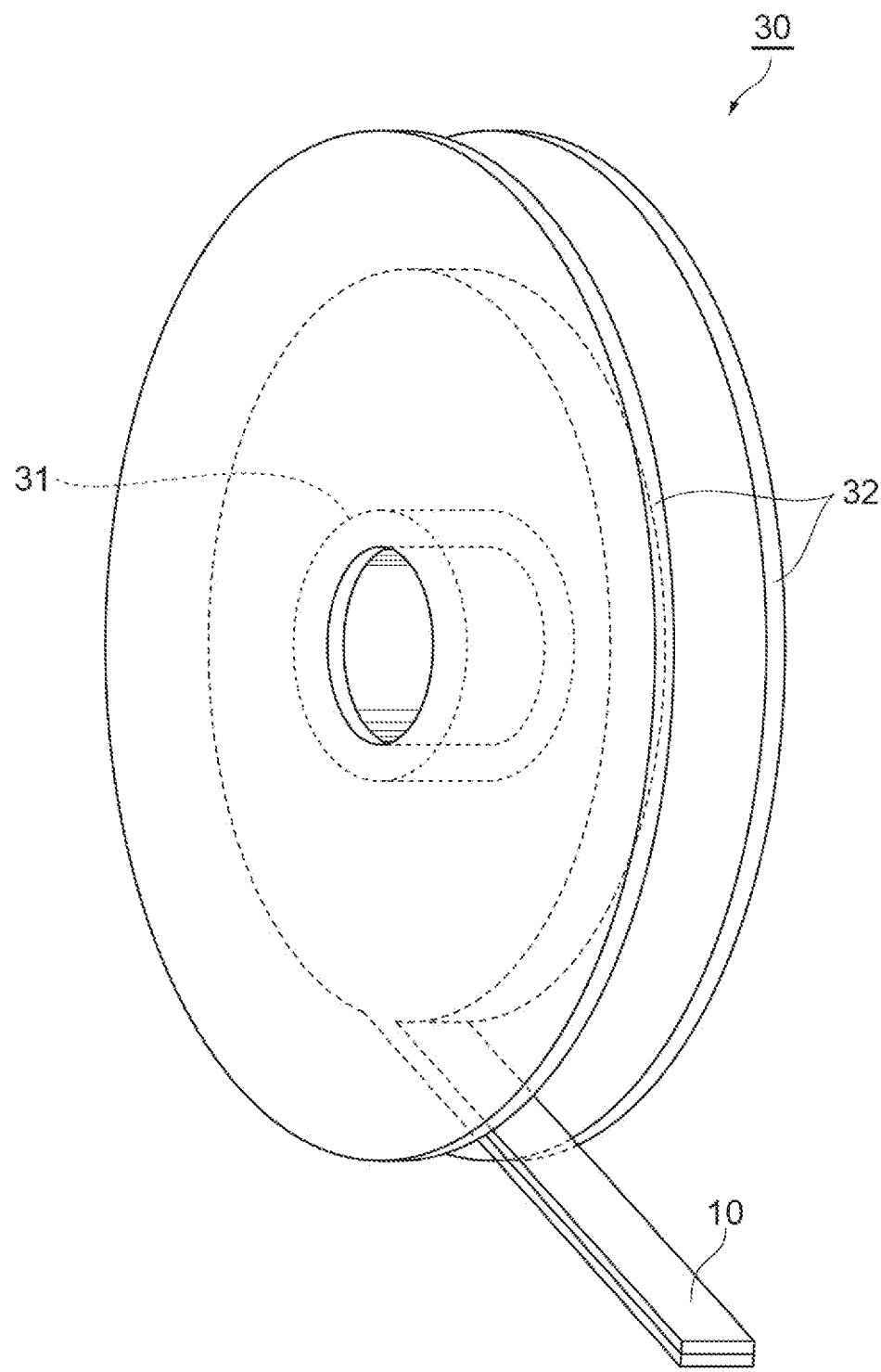
FIG. 6 is a perspective view illustrating an embodiment of a reel body.

FIG. 6 is a perspective view illustrating an embodiment of the reel body. The reel body 30 shown in FIG. 6 comprises a winding core 31, a temporary protective film 10 wound around the winding core 31, and side plates 32.

The width (length in a direction orthogonally intersecting the winding direction) of the winding core 31 and the temporary protective film 10 may be, for example, 10 mm or more, 40 mm or more, 60 mm or more, or 80 mm or more, and may be 350 mm or less. The width (length in a direction orthogonally intersecting the winding direction) of the winding core 31 and the temporary protective film 10 may be, for example, from 10 mm to 350 mm, from 40 mm to 350 mm, or from 80 mm to 350 mm.

Figure 7:
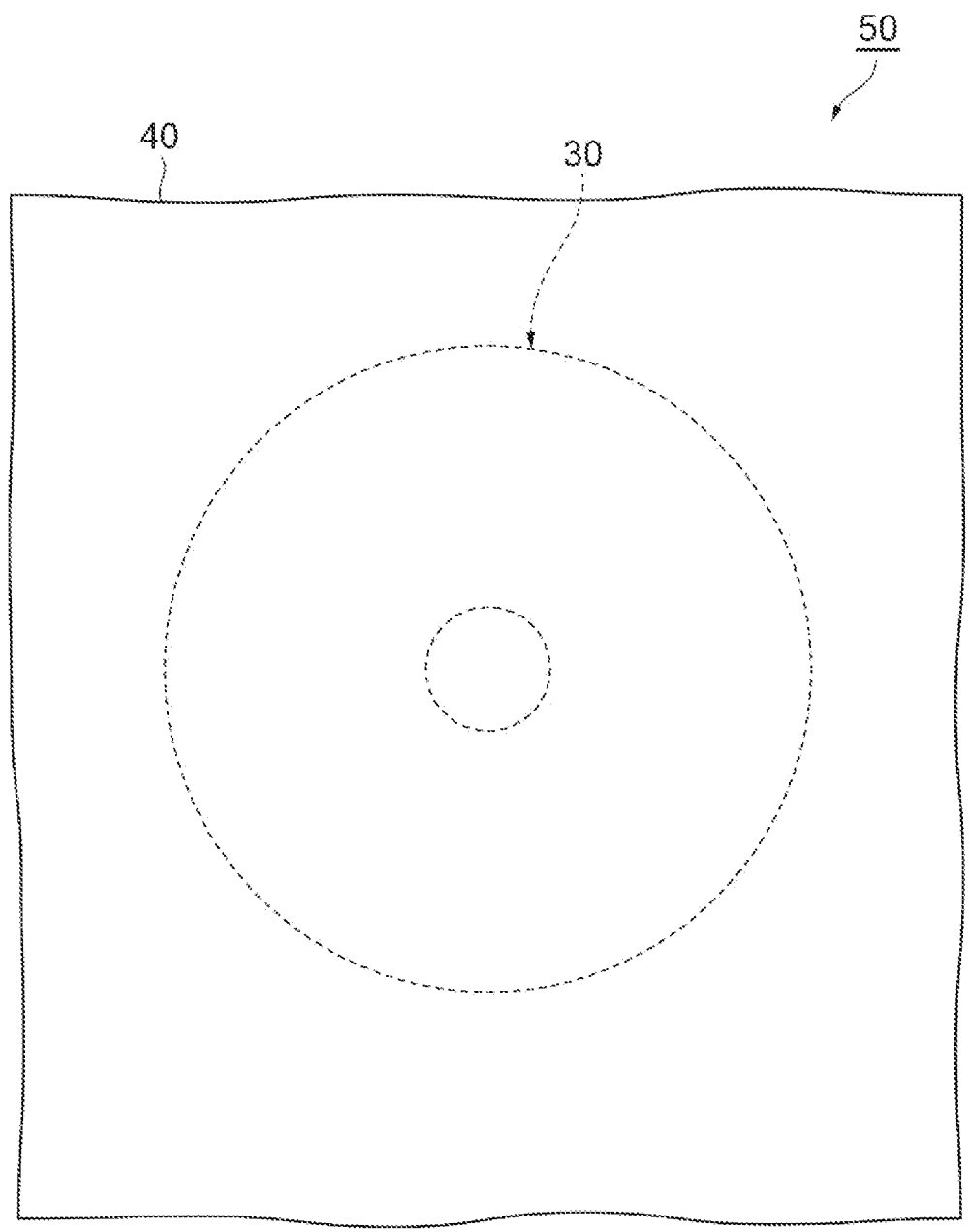
FIG. 7 is a front view illustrating an embodiment of a package.

The temporary protective film according to the above-mentioned embodiments may be provided as a package in which the above-described reel body is housed in a packaging bag. FIG. 7 shows an embodiment of the package. As shown in FIG. 7, the package 50 comprises the above-described reel body 30, and a packaging bag 40 having the reel body 30 housed therein. The reel body 30 is usually individually housed in the packaging bag; however, it is also acceptable that a plurality (for example, two or three) of reel bodies 30 are housed in one packaging bag 40.

The packaging bag 40 may be formed from a resin film or may be formed from a composite film, which is a resin film having an aluminum layer. Specific examples of the packaging bag 40 include an aluminum-coated plastic bag. Examples of the material for the resin film include plastics such as polyethylene, polyester, vinyl chloride, and polyethylene terephthalate. The reel body 30 may be housed in, for example, a packaging bag in a state of being vacuum-packed. The package 50 is not limited to a vacuum-packed package.

The packaging bag 40 may have a desiccant housed together with the reel body 30. Examples of the desiccant include silica gel. The package 50 may be a product obtained by further wrapping up the packaging bag 40 having the reel body 30 housed therein, with a buffer material.

Figure 8:
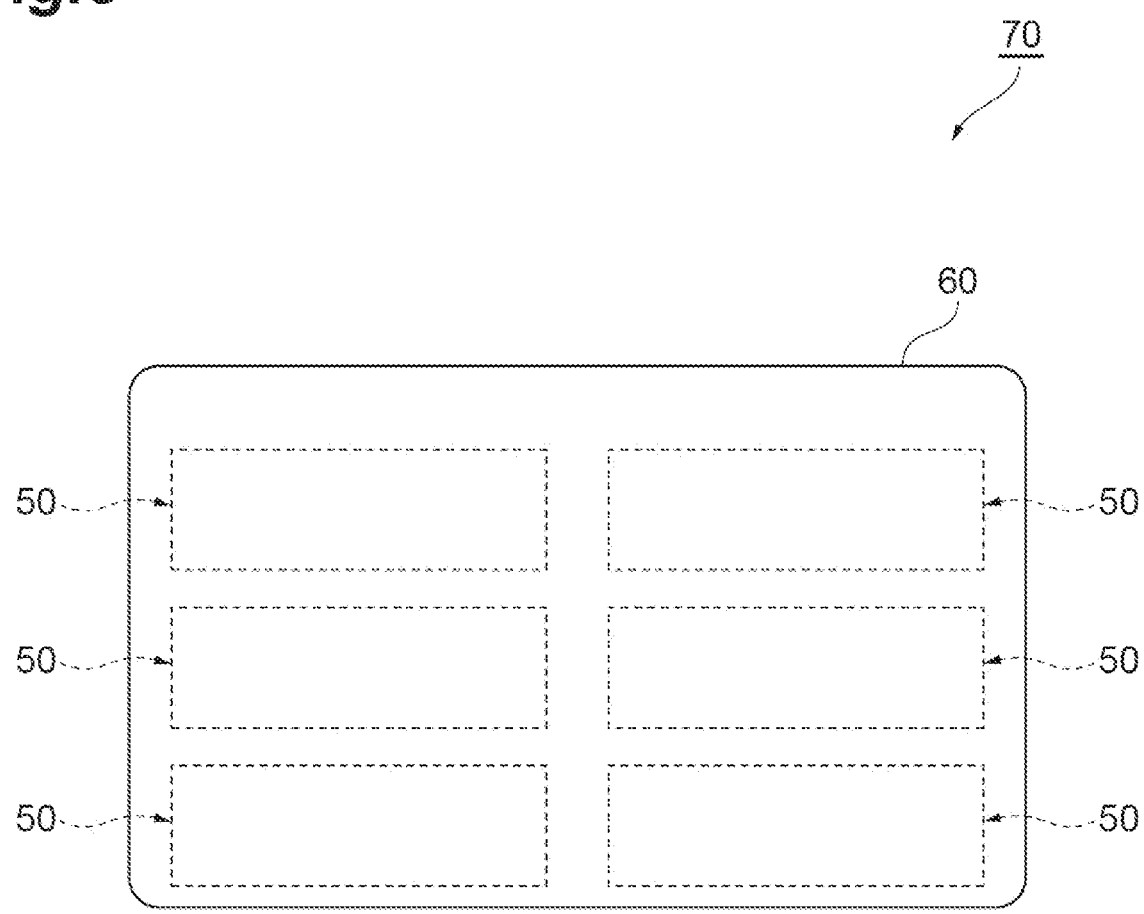
FIG. 8 is a front view illustrating an embodiment of a packed article.

The package 50 may be provided as a packed article housed in a packing box. FIG. 8 shows an embodiment of a packed article. As shown in FIG. 8, the packed article 70 comprises the package 50 and a packing box 60 having the package 50 housed therein. In the packing box 60, one package 50 or a plurality of packages 50 are housed. As the packing box 60, for example, corrugated cardboard can be used.

A semiconductor device manufactured by using the temporary protective film according to an embodiment is excellent in terms of density increase, area reduction, thickness reduction, and the like, and can be suitably utilized for, for example, electronic equipment such as mobile telephones, smartphones, personal computers, and tablets.

EXAMPLES

Hereinafter, the present invention will be described more specifically by way of Examples; however, the present invention is not intended to be limited to the following Examples.

1. Production of Varnish for Forming Adhesive Layer or Non-Adhesive Layer

Varnish A-1 (Varnish for Forming Adhesive Layer)

Into a four-necked 5-liter flask equipped with a thermometer, a stirrer, a nitrogen inlet tube, and a fractionating column, 270.9 g (0.66 mol) of 2,2-bis[-(4-aminophenoxy)phenyl]propane and 8.7 g (0.035 mol) of 1,3-bis(3-aminopropyl)-tetramethyldisiloxane were introduced in a nitrogen atmosphere, and this mixture was dissolved in 1950 g of N-methyl-2-pyrrolidone. The solution was cooled to 0° C., and at this temperature, 149.5 g (0.71 mol) of trimellitic anhydride chloride was added to the solution. After trimellitic anhydride chloride was dissolved, 100 g of triethylamine was added to the solution. The mixture was continuously stirred for 2 hours at room temperature, subsequently the temperature was raised to 180° C., and imidization was completed by a reaction for 5 hours. Next, the reaction liquid was thrown into methanol to precipitate a polymer. The precipitated polymer was dried and then dissolved in N-methyl-2-pyrrolidone. The solution was thrown into methanol to precipitate the polymer again. The precipitated polymer was dried under reduced pressure to obtain a purified polyetheramideimide in a powder form. 120 g of the obtained polyetheramideimide and 3.6 g of a silane coupling agent (manufactured by Shin-Etsu Chemical Co., Ltd., trade name: SH6040) were dissolved in 360 g of N-methyl-2-pyrrolidone, and a varnish A-1 including an aromatic polyetheramideimide was obtained.

Varnish A-2 (Varnish for Forming Adhesive Layer)

Into a four-necked 5-liter flask equipped with a thermometer, a stirrer, a nitrogen inlet tube, and a fractionating column, 258.6 g (0.63 mol) of 2,2-bis[4-(4-aminophenoxy)phenyl]propane and 67.0 g (0.27 mol) of 1,3-bis(3-aminopropyl)tetramethyldisiloxane were introduced in a nitrogen atmosphere, and this mixture was dissolved in 1550 g of N-methyl-2-pyrrolidone. Furthermore, this solution was cooled to 0° C., and at this temperature, 187.3 g (0.89 mol) of trimellitic anhydride chloride was added to the solution. After trimellitic anhydride chloride was dissolved, 100 g of triethylamine was added to the solution. The mixture was continuously stirred for 2 hours at room temperature, subsequently the temperature was raised to 180° C., and imidization was completed by a reaction for 5 hours. Next, the reaction liquid was thrown into methanol to precipitate a polymer. The precipitated polymer was dried and then dissolved in N-methyl-2-pyrrolidone. The solution was thrown into methanol to precipitate the polymer again. The precipitated polymer was dried under reduced pressure to obtain a purified polyetheramideimide in a powder form. 120 g of the obtained polyetheramideimide and 3.6 g of a silane coupling agent (manufactured by Shin-Etsu Chemical Co., Ltd., trade name: SH6040) were dissolved in 360 g of N-methyl-2-pyrrolidone, and a varnish A-2 including an aromatic polyetheramideimide was obtained.

Varnish B-1 (Varnish for Forming Non-Adhesive Layer)

Into a four-necked 5-liter flask equipped with a thermometer, a stirrer, a nitrogen inlet tube, and a fractionating column, 172.4 g (0.42 mol) of 2,2-bis[4-(4-aminophenoxy) phenyl]propane and 153.7 g (0.42 mol) of 4,4'-methylenebis (2,6-diisopropylaniline) were introduced in a nitrogen atmosphere, and this mixture was dissolved in 1550 g of N-methyl-2-pyrrolidone. Furthermore, this solution was cooled to 0° C., and at this temperature, 174.7 g (0.83 mol) of trimellitic anhydride chloride was added to the solution. After trimellitic anhydride chloride was dissolved, 130 g of triethylamine was added to the solution. The mixture was continuously stirred for 2 hours at room temperature, subsequently the temperature was raised to 180° C., and imidization was completed by a reaction for 5 hours. Next, the reaction liquid was thrown into methanol to precipitate a polymer. The precipitated polymer was dried and then dissolved in N-methyl-2-pyrrolidone. The solution was thrown into methanol to precipitate the polymer again. The precipitated polymer was dried under reduced pressure to obtain a purified polyetheramideimide in a powder form. 120 g of the obtained polyetheramideimide and 6 g of a silane coupling agent (manufactured by Shin-Etsu Chemical Co., Ltd., trade name: SH6040) were dissolved in 360 g of N-methyl-2-pyrrolidone, and a varnish B-1 including an aromatic polyetheramideimide was obtained.

Varnish B-2 (Varnish for Forming Non-Adhesive Layer)

40 g of the polyetheramideimide synthesized in Production Example 3 and 2 g of a silane coupling agent (manufactured by Shin-Etsu Chemical Co., Ltd., trade name: SH6040) were dissolved in 500 g of N-methyl-2-pyrrolidone, and a varnish B-2 including an aromatic polyetheramideimide was obtained.

2. Production and Evaluation of Temporary Protective Film

Method for Measuring Surface Roughness Ra

The surface roughness Ra of a surface of the non-adhesive layer, the surface being on the opposite side of the surface that was in contact with the support film (back face of the temporary protective film), was measured using a shape measuring laser microscope VK-X100 manufactured by Keyence Corporation, under the following Condition 1 or Condition 2.

Condition 1: Magnification ratio of the object lens 50 times, laser wavelength 658 nm Condition 2: Magnification ratio of the object lens 10 times, laser wavelength 658 nm Example 1

A polyimide film (manufactured by DuPont-Toray Co., Ltd., KAPTON 100EN) having a thickness of 25 μm was used as a support film. The varnish A-1 was flow cast to a thickness of 25 μm on one surface of this polyimide film. The coating film was dried for 10 minutes at 100° C. and for 10 minutes at 300° C. to obtain a temporary protective film comprising an adhesive layer having a thickness of 3 μm on one surface of the support film. The adhesive layer was a layer having a glass transition temperature of 230° C., a 5% weight reduction temperature of 451° C., and an elastic modulus at 230° C. of 150 MPa. Furthermore, the varnish B-1 was flow cast to a thickness of 20 μm on the surface of the polyimide film on the opposite side from the surface provided with the adhesive layer. The coating film was dried for 10 minutes at 100° C. and for 10 minutes at 300° C. to form a non-adhesive layer having a thickness of 2 μm. This non-adhesive layer was a layer having a glass transition temperature of 260° C., a 5% weight reduction temperature of 421° C., and an elastic modulus at 230° C. of 1700 MPa.

As a result, as shown in FIG. 1, a temporary protective film of Example 1, in which an adhesive layer was provided on one surface of a support film, and a non-adhesive layer was provided on the other surface of the support film, was obtained. The ratio of the thickness (A) of the adhesive layer with respect to the thickness (C) of the support film was 0.12. In the temporary protective film of Example 1, the surface roughness (Ra) of the surface of the non-adhesive layer on the opposite side from the surface in contact with the support film (back face of the temporary protective film) was 0.26 μm under the Condition 1 and 0.6 μm under the Condition 2.

The temporary protective film of Example 1 was adhered to a palladium-coated copper lead frame (50 mm×200 mm) at a temperature of 250° C., a pressure of 8 MPa, and a duration of 10 seconds, the 90° peel strength (peeling rate: 300 mm per minute; hereinafter, the same) between the adhesive layer and the lead frame at 25° C. was measured, and a problem of peeling during conveyance at 50 N/m did not occur. Curling of the temporary protective film almost did not occur, and the workability at the time of adhesion was satisfactory.

Figure 5:
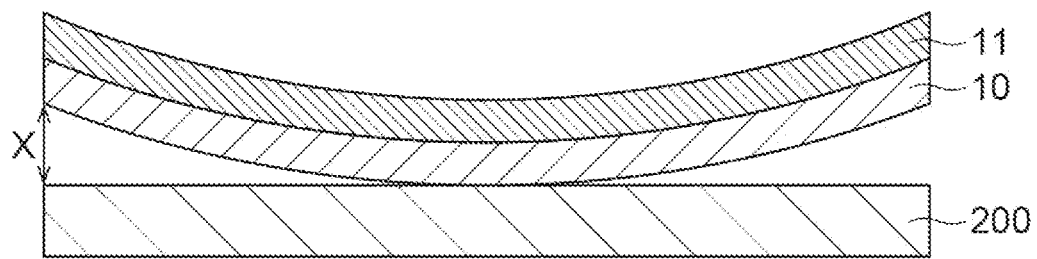
FIG. 5 is a diagram illustrating the point of measurement of warpage of a temporary protective film-attached lead frame.

The warpage of the temporary protective film of Example 1 was measured. FIG. 5 is a schematic diagram illustrating a method for evaluating warpage. As shown in FIG. 5, a temporary protective film-attached lead frame obtained by sticking the temporary protective film 10 to a lead frame 11 was placed on a support base 200, and the warpage (X) in the longitudinal direction of this temporary protective film-attached lead frame was measured. The warpage (X) caused by the temporary protective film of Example 1 was measured, and as a result, the warpage (X) was about 0.1 mm.

Using the produced temporary protective film-attached lead frame, adhesion of a semiconductor element, a wire bonding step, and an encapsulation step were carried out. As a result, problems such as stopping due to conveyance failure of the lead frame were not observed in any of the steps. The obtained packages had the structure shown in FIG. 3. A silver paste was used for the adhesion of the semiconductor element, and the silver paste was cured by heating for 60 minutes at 150° C. Wire bonding was carried out by using a gold wire as the wire and heating the wire for 5 minutes at 260° C. In the encapsulation step, a biphenyl encapsulant (manufactured by Hitachi Chemical Co., Ltd., trade name: CEL9200) was used as the encapsulant. An encapsulation layer was formed at a temperature of 180° C. and a pressure of 10 MPa for a duration of 3 minutes, and subsequently, the encapsulation layer was cured by heating at 180° C. for 5 hours. No problem occurred in any of the steps. After the encapsulation step, the temporary protective film was torn off from the lead frame and the encapsulant at 200° C., and the temporary protective film was easily torn off, with the 90° peel strength being 150 N/m, while the resin almost did not remain on the lead frame and the encapsulating resin. A very small amount of the resin remaining thereon could be removed by washing with N-methyl-2-pyrrolidone. Furthermore, this package was divided to produce packages each having one semiconductor element as shown in FIG. 4. There was no problem during the step.

Example 2

A polyimide film (manufactured by Ube Industries, Ltd., UPILEX SPA) having a thickness of 25 µm was used as a support film. The varnish A-1 was flow cast to a thickness of 40 µm on one surface of this polyimide film. The coating film was dried for 10 minutes at 100° C. and for 10 minutes at 300° C. to obtain a temporary protective film comprising an adhesive layer having a thickness of 6 µm on one surface of the support film. The adhesive layer was a layer having a glass transition temperature of 230° C., a 5% weight reduction temperature of 451° C., and an elastic modulus at 230° C. of 150 MPa. Furthermore, the varnish B-2 was flow cast to a thickness of 100 µm on the surface of the polyimide film on the opposite side from the surface provided with the adhesive layer. The coating film was dried for 10 minutes at 100° C. and for 10 minutes at 300° C. to form a non-adhesive layer having a thickness of 5 µm. This non-adhesive layer was a layer having a glass transition temperature of 260° C., a 5% weight reduction temperature of 421° C., and an elastic modulus at 230° C. of 1700 MPa. As a result, as shown in FIG. 1, a temporary protective film of Example 2, in which an adhesive layer was provided on one surface of a support film, and a non-adhesive layer was provided on the other surface of the support film, was obtained. The ratio of the thickness (A) of the adhesive layer with respect to the thickness (C) of the support film was 0.24. In the temporary protective film of Example 2, the surface roughness (Ra) of the surface of the non-adhesive layer on the opposite side from the surface in contact with the support film (back face of the temporary protective film) was 0.22 µm under the Condition 1 and 0.8 µm under the Condition 2.

Example 3

A polyimide film (manufactured by Ube Industries, Ltd., UPILEX SGA) having a thickness of 25 µm was used as a support film. The varnish A-1 was flow cast to a thickness of 60 µm on one surface of this polyimide film. The coating film was dried for 10 minutes at 100° C. and for 10 minutes at 300° C. to obtain a temporary protective film comprising an adhesive layer having a thickness of 9 µm on one surface of the support film. The adhesive layer was a layer having a glass transition temperature of 230° C., a 5% weight reduction temperature of 451° C., and an elastic modulus at 230° C. of 150 MPa. Furthermore, the varnish B-2 for forming a non-adhesive layer as produced in Production Example 2 was flow cast to a thickness of 180 µm on the surface of the polyimide film on the opposite side from the surface provided with the adhesive layer, and was dried for 10 minutes at 100° C. and for 10 minutes at 300° C. to form a non-adhesive layer having a thickness of 9 µm. This non-adhesive layer had a glass transition temperature of 260° C., a 5% weight reduction temperature of 421° C., and an elastic modulus at 230° C. of 1700 MPa. As a result, as shown in FIG. 1, a temporary protective film of Example 3, in which an adhesive layer was provided on one surface of a support film, and a non-adhesive layer was provided on the other surface of the support film, was obtained. The ratio of the thickness (A) of the adhesive layer with respect to the thickness (C) of the support film was 0.36. In the temporary protective film of Example 3, the surface roughness (Ra) of the surface of the non-adhesive layer on the opposite side from the surface in contact with the support film (back face of the temporary protective film) was 0.67 µm under the Condition 1 and 1.1 µm under the Condition 2.

Comparative Example 1

A polyimide film (manufactured by Ube Industries, Ltd., UPILEX SPA) having a thickness of 25 µm and having the surface subjected to a plasma treatment was used as a support film. The varnish A-2 was flow cast to a thickness of 50 µm on one surface of this polyimide film. The coating film was dried for 10 minutes at 100° C. and for 10 minutes at 300° C. to form an adhesive layer having a thickness of 10 µm. This adhesive layer was a layer having a glass transition temperature of 187° C., a 5% weight reduction temperature of 429° C., and an elastic modulus at 230° C. of 5 MPa. Furthermore, the varnish B-1 was flow cast to a thickness of 50 µm on the surface of the polyimide film on the opposite side. The coating film was dried for 10 minutes at 100° C. and for 10 minutes at 300° C. to form a non-adhesive layer having a thickness of 10 µm. This non-adhesive layer was a layer having a glass transition temperature of 260° C., a 5% weight reduction temperature of 421° C., and an elastic modulus at 230° C. of 1700 MPa. As a result, as shown in FIG. 1, a temporary protective film of Comparative Example 1, in which an adhesive layer was provided on one surface of a support film, and a non-adhesive layer was provided on the other surface of the support film, was obtained. In the temporary protective film of Comparative Example 1, the surface roughness (Ra) of the surface of the non-adhesive layer on the opposite side from the surface in contact with the support film (back face of the temporary protective film) was 0.05 µm under the Condition 1 and 0.3 µm under the Condition 2.

After the temporary protective film was adhered to a palladium-coated copper lead frame at a temperature of 250° C. and a pressure of 8 MPa for a duration of 10 seconds, the 90° peel strength between the temporary protective film and the lead frame at 25° C. was measured, and there was no problem of peeling during conveyance at 150 N/m. Curling of the temporary protective film almost did not occur, and the workability at the time of adhesion was satisfactory. As in the case of Example 1, the warpage (X) in the longitudinal direction of lead frame was measured, and the value was about 0.15 mm Using this lead frame having the temporary protective film adhered thereto, adhesion of a semiconductor element, a wire bonding step, and an encapsulation step were carried out in the same manner as in Example 1; however, conveyance failure was observed because sliding between the lead frame and the stage was poor in the conveyance step for the lead frame.

The temporary protective films of the Examples, in which the surface roughness (Ra) of the back face is 0.1 µm or more under the Condition 1 and 0.4 µm or more under the Condition 2, have high close adhesiveness to the lead frame at 25° C., and furthermore, since the temporary protective films can be torn off from the lead frame and the encapsulant after being resin-encapsulated, semiconductor packages can be manufactured with high workability and productivity. In contrast, the adhesive films for semiconductor of the Comparative Example, in which the surface roughness (Ra) of the back face is less than 0.1 µm under the Condition 1 and less than 0.4 µm under the Condition 2, exhibited conveyance failure with poor sliding on the stage in the semiconductor assembling process, and the adhesive films exhibit inferior workability and productivity compared to the temporary protective films of the Examples.

Comparative Example 2

A polyimide film (manufactured by Ube Industries, Ltd., UPILEX SPA) having a thickness of 25 μm was used as a support film. The varnish A-1 was flow cast to a thickness of 40 μm on one surface of this polyimide film. The coating film was dried for 10 minutes at 100° C. and for 10 minutes at 300° C. to obtain a temporary protective film comprising an adhesive layer having a thickness of 6 μm on one surface of a support film. The adhesive layer was a layer having a glass transition temperature of 230° C., a 5% weight reduction temperature of 451° C., and an elastic modulus at 230° C. of 150 MPa. Furthermore, the varnish B-1 was flow cast to a thickness of 35 μm on the surface of the polyimide film on the opposite side from the surface provided with the adhesive layer. The coating film was dried for 10 minutes at 100° C. and for 10 minutes at 300° C. to form a non-adhesive layer having a thickness of 5 μm. This non-adhesive layer was a layer having a glass transition temperature of 260° C., a 5% weight reduction temperature of 421° C., and an elastic modulus at 230° C. of 1700 MPa. As a result, as shown in FIG. 1, a temporary protective film of Comparative Example 2, in which an adhesive layer was provided on one surface of a support film, and a non-adhesive layer was provided on the other surface of the support film, was obtained. The ratio of the thickness (A) of the adhesive layer with respect to the thickness (C) of the support film was 0.24. In the temporary protective film of Comparative Example 2, the surface roughness (Ra) of the surface of the non-adhesive layer on the opposite side from the surface in contact with the support film (back face of the temporary protective film) was 0.06 μm under the Condition 1 and 0.3 μm under the Condition 2.

Evaluation of Slipperiness of Back Face of Temporary Protective Film

The slipperiness of a surface (back face) of each of the temporary protective films of Examples 1, 2, and 3 and Comparative Examples 1 and 2, the surface being on the opposite side of the surface in contact with the lead frame, was evaluated by the following friction test. The temporary protective film was fixed to a flat support base in a direction so that the surface that was not in contact with the lead frame (back face) faced upward. A standard attachment flat type A-2 for force gauge (manufactured by Imada Co., Ltd., made of aluminum, weight 2.5 g, ϕ13 mm) was placed on the temporary protective film in a direction so that the flat surface of the standard attachment faced downward and was caused to slide, and the maximum value of stress at that time was measured using a force gauge (DPS-0.5 manufactured by Imada Co., Ltd.). The measurement results are shown in Table 1.

TABLE 1

| | Support film | Adhesive layer | | Non-adhesive layer | | Back face roughness Ra (Condition 1) | Slipperiness (maximum value of stress in friction test) |
|---|---|---|---|---|---|---|---|
| | | Varnish | Thickness | Varnish | Thickness | | |
| Ex. 1 | KAPTON 100EN | A-1 | 3 μm | B-1 | 2 μm | 0.26 μm | 1.8 gf |
| Ex. 2 | UPILEX 25SPA | A-1 | 6 μm | B-2 | 5 μm | 0.22 μm | 1.6 gf |
| Ex. 3 | UPILEX 25SGA | A-1 | 9 μm | B-2 | 9 μm | 0.67 μm | 1.8 gf |
| Comp. Ex. 1 | UPILEX 25SPA | A-2 | 10 μm | B-1 | 10 μm | 0.05 μm | 2.5 gf |
| Comp. Ex. 2 | UPILEX 25SPA | A-1 | 6 μm | B-1 | 5 μm | 0.06 μm | 2.4 gf |

The temporary protective films of the Examples had low maximum values of stress in the friction test, as compared to the temporary protective films of the Comparative Examples. When the temporary protective film of Example 1 was used, it was verified that there was no conveyance failure. In contrast, when the temporary protective film of Comparative Example 1 was used, conveyance failure occurred. In the case of the temporary protective films of Examples 1 and 2 that exhibited maximum values of stress equal to or less than the maximum value of stress of the temporary protective film of Example 1 in the friction test, it can also be said that the conveyance failure is sufficiently suppressed.

REFERENCE SIGNS LIST

1: support film, 2: adhesive layer, 3: non-adhesive layer, 10: temporary protective film, 11: lead frame, 11a: die pad, 11b: inner lead, 12: wire, 13: encapsulation layer, 14: semiconductor element, 20: encapsulation molded body, 30: reel body, 31: winding core, 32: side plate, 40: packaging bag, 50: package, 60: packing box, 70: packed article, 100: semiconductor device.

The invention claimed is:

1. A method for manufacturing a semiconductor device including an encapsulation molded body, wherein the encapsulation molded body comprises a lead frame including a die pad and an inner lead and adapted to be conveyed on a stage during the manufacture of the semiconductor device, a semiconductor element, a wire and an encapsulation layer, the method comprising:
   providing a temporary protective film including:
      a support film having a first surface and a second surface;
      an adhesive layer provided on the first surface of the support film; and
      a non-adhesive layer provided on the second surface of the support film;

attaching the temporary protective film to a surface of the lead frame in such a direction that the adhesive layer of the temporary protective film is in contact with the lead frame to obtain a temporary protective film-attached lead frame;

mounting the semiconductor element to a surface of the die pad on an opposite side from the temporary protective film;

providing a wire connecting the semiconductor element and the inner lead;

forming the encapsulation layer encapsulating the semiconductor element, the temporary protective film-attached lead frame, and the wire to obtain a temporary protective film-attached encapsulation molded body;

conveying the temporary protective film-attached lead frame by sliding the temporary protective film-attached encapsulation molded body on the stage, wherein the non-adhesive layer of the temporary protective film provides a contact surface with the stage during the conveyance; and detaching the temporary protective film from the temporary protective film-attached encapsulation molded body to obtain the encapsulation molded body, wherein the temporary protective film-attached lead frame is conveyed on the stage with conveyance failure being suppressed before detaching the temporary protective film from the temporary protective film-attached encapsulation molded body, wherein the non-adhesive layer has a thickness of 10 μm or less, and wherein the contact surface of the non-adhesive layer has a surface roughness of 0.1 μm or more, as measured by a laser microscope under such a condition that a magnification ratio of an object lens is 50 times, and is thereby configured to suppress the conveyance failure on the stage.

2. The method according to claim 1, further comprising connecting the semiconductor element mounted on the die pad and the inner lead using an electroconductive material by reflow.

3. The method according to claim 1, wherein the adhesive layer is configured to have a 90° peel strength, between the adhesive layer and the lead frame, of 5 N/m or more at 25° C. when the temporary protective film is attached to the lead frame so that the adhesive layer is in contact with the lead frame.

4. The method according to claim 1, wherein the adhesive layer is configured to have a 90° peel strength, between the adhesive layer and the lead frame as well as the encapsulation layer, of 1000 N/m or less in at least a portion of a temperature range of 0° C. to 250° C. when the temporary protective film is attached to the lead frame so that the adhesive layer is in contact with the lead frame, the semiconductor element is mounted on a surface of the die pad on an opposite side from the temporary protective film, and the encapsulation layer encapsulating the semiconductor element is in contact with the adhesive layer.

5. The method according to claim 1, wherein the adhesive layer comprises a thermoplastic resin having at least one functional group selected from the group consisting of an amide group, an ester group, an imide group, an ether group, and a sulfone group.

6. The method according to claim 1, wherein the adhesive layer comprises a thermoplastic resin having at least one functional group selected from the group consisting of an amide group, an ester group, an imide group, and an ether group.

7. The method according to claim 1, wherein the temporary protective film comprises a support film located between the adhesive layer and the non-adhesive layer, and
wherein a ratio of a thickness of the adhesive layer to a thickness of the support film is 0.5 or less.

8. The method according to claim 7, wherein the support film is a film comprising a polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, a polyallylate, an aromatic polyether ether ketone, and polyethylene naphthalate.

9. The method according to claim 1, wherein, when a standard attachment for a force gauge weighing 2.5 g and having a flat surface with a diameter of 13 mm is placed on the non-adhesive layer of the temporary protective film in a direction so that the flat surface of the standard attachment faces downward and is then caused to slide on the non-adhesive layer, a maximum value of stress as measured by using the force gauge is 1.8 gf or less.

* * * * *